United States Patent [19]
Kinoshita

[11] Patent Number: 6,101,737
[45] Date of Patent: Aug. 15, 2000

[54] APPARATUS AND METHOD FOR DRYING A SEMICONDUCTOR MEMBER

[75] Inventor: Takatoshi Kinoshita, Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 09/132,664

[22] Filed: Aug. 12, 1998

[30] Foreign Application Priority Data

Feb. 20, 1998 [JP] Japan ................................ 10-039148

[51] Int. Cl.[7] .................................................. F26B 3/00
[52] U.S. Cl. ................ 34/340; 34/469; 34/470; 34/471; 34/75; 34/78; 134/108; 134/902
[58] Field of Search ........................... 34/337, 339, 340, 34/467, 468, 469, 470, 471, 75, 78; 134/105, 108, 902

[56] References Cited

U.S. PATENT DOCUMENTS 5,371,950  12/1994  Schumacher .......................... 34/78
5,539,995  7/1996  Bran ........................................ 34/77
5,954,911  9/1999  Bergman et al. ..................... 156/345

FOREIGN PATENT DOCUMENTS 4-352424  12/1992  Japan .

*Primary Examiner*—Pamela A. Wilson
*Attorney, Agent, or Firm*—McDermott, Will & Emery

[57] ABSTRACT

A drying apparatus and method of drying is provided for drying a semiconductor member mounted in a carrier that is placed in a processing tank through contact with isopropyl alcohol. An isopropyl alcohol liquid is vaporized in a bottom portion of the processing tank, and the resulting vapor is condensed in its top portion. A heater is disposed so as to heat the inside of the processing tank to keep the inside at a predetermined temperature range in a middle-layer portion, i.e., a drying portion, of the processing tank. The heater is covered with a heat insulating member.

5 Claims, 2 Drawing Sheets

APPARATUS AND METHOD FOR DRYING A SEMICONDUCTOR MEMBER

BACKGROUND OF THE INVENTION

1. Field of the Invention

The present invention relates to a drying apparatus for drying a semiconductor member such as a semiconductor wafer or a mask. More specifically, the invention relates to an improvement of a drying apparatus for drying a drying subject member such as a semiconductor member by using a vapor of isopropyl alcohol (IPA) produced by heating.

2. Background Art

Among various methods for drying a semiconductor member such as a semiconductor wafer or a mask that has been subjected to rinsing or the like, there is a method in which a semiconductor wafer is dried by placing it in a vapor of isopropyl alcohol (IPA). The subject member to be dried may be expanded to other than a semiconductor member, however, hereinafter the term semiconductor wafer is used to typify a drying subject member in a broader term including a semiconductor members in general.

FIG. 3 schematically shows a configuration of such a conventional drying machine. As shown in FIG. 3, in the conventional drying machine, a heater 3 is provided under a quartz tank 1 and a vapor of isopropyl alcohol is produced by heating an isopropyl alcohol liquid 2 with the heater 3. To prevent the vapor from escaping outside, a cooling coil 10 for trapping the vapor is provided at the upper portion of the tank 1. In this manner, the inside of the quartz tank 1 is filled with the vapor of isopropyl alcohol. A semiconductor wafer 5 is dried by placing it in the vapor together with a carrier 4. A wafer drop tray 6 receives water droplets from the wafer.

However, in the above conventional method, the temperature inside the quartz tank 1 rapidly decreases when the carrier 4 and the semiconductor wafer 5 are placed in the quarts tank 1. This causes a problem that the drying performance is poor, the drying time long, and stains are prone to occur until the original temperature is restored.

SUMMARY OF THE INVENTION

The present invention has been made to solve the above problem in the conventional art, and an object of the present invention is therefore to prevent a rapid temperature decrease upon input of a drying subject member such as a semiconductor wafer to a processing tank, to thereby provide a drying apparatus capable of efficiently drying a drying subject member.

According to one aspect of the present invention, a semiconductor member drying apparatus comprises a processing tank for housing a semiconductor member mounted in a carrier. A heating means is disposed at a bottom-layer position of the processing tank, and vaporize an isopropyl alcohol liquid that is provided in the processing tank. A cooling means is disposed at a top-layer position of the processing tank, and condenses a vapor of isopropyl alcohol. A heat retaining means is disposed at a middle-layer position of the processing tank so as to extend from below the carrier to a position close to the cooling means, and heats the inside of the processing tank to keep the inside at a predetermined temperature. Further, a heat insulating member is disposed so as to cover the heat retaining means.

In another aspect, a temperature control means is provided for detecting and controlling the temperature of the heat retaining means.

In the semiconductor member drying apparatus, the temperature control means controls the temperature of the heat retaining means preferably at 80°–82° C.

In another aspect, the carrier holds the semiconductor member so that a principal surface of the semiconductor member is directed downward.

Other and further objects, features and advantages of the invention will appear more fully from the following description.

BEST MODE OF CARRYING OUT THE INVENTION

Some embodiments of the present invention will be described with reference to the accompanying drawings.

First Embodiment

Figure 1:
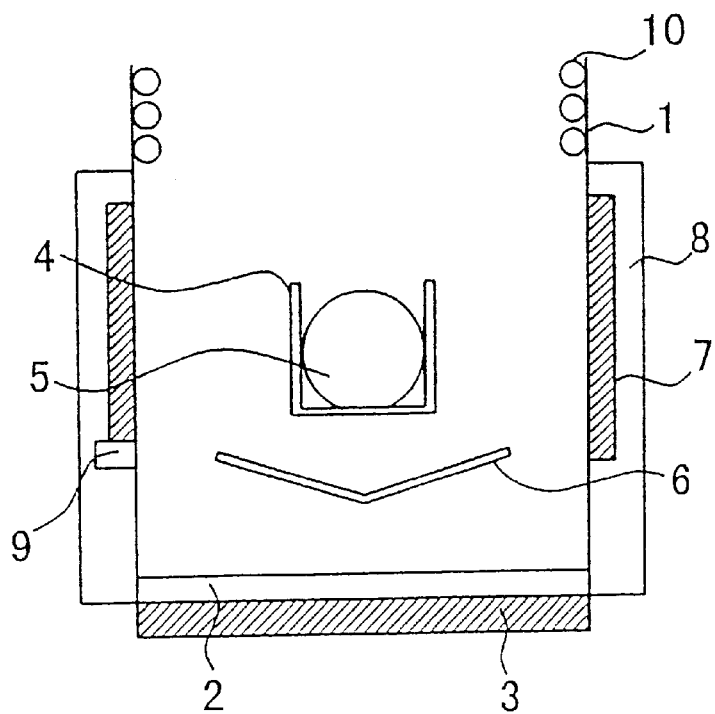
FIG. 1 shows the configuration of a semiconductor member drying apparatus according to a first embodiment of the present invention.

FIG. 1 shows the configuration of a semiconductor member drying apparatus according to a first embodiment of the present invention. Although the term semiconductor member broadly includes a semiconductor wafer, a mask, etc. that are used in semiconductor devices or their manufacture, they will be typified by a term semiconductor wafer in the following description.

In FIG. 1, reference numeral 1 denotes a semiconductor wafer drying processing tank, which is specifically a quartz tank. An isopropyl alcohol liquid is introduced to the bottom-layer portion of the processing tank 2, and a heater 3 as a heating means is disposed under the processing tank 2 to heat and vaporize the isopropyl alcohol liquid 2. A semiconductor wafer carrier 4 in which a semiconductor wafer 5 is mounted is put in the processing tank 1 so as to be located at a middle-layer position, whereby the semiconductor wafer 5 is exposed to the vapor of isopropyl alcohol. A water drop tray or a condensate liquid tray 6 receives and discharges water drops or a condensate liquid that drops from the semiconductor wafer 5.

A heater 7 as a heat retaining means is fixed to the outer surface of the circumferential wall of the processing tank 1 at a middle-layer position, and serves to heat the inside of the processing tank 1 or keep the temperature of the circumferential wall of the processing tank 1. Alternatively, the heat retaining means 7 is controlled so as to keep itself at a predetermined temperature. The heat retaining means 7 is covered with a heat insulating member 8. A temperature detecting means 9 detects the temperature of the heat retaining means 7 or the circumferential wall of the processing tank 1. A cooling coil 10 as a cooling means is disposed at a top-layer position of the processing tank 1, and serves to cool and condense the vapor of isopropyl alcohol coming up after the evaporation.

Preferably, the heat retaining means 7 is disposed so as to extend from below the carrier 4 that is placed inside the processing tank 1 to a position close to the cooling means 10. The heat retaining means 7 operates to keep the inside of the processing tank 1 at a temperature equal to or higher than the vaporization temperature of isopropyl alcohol, preferably at 80°–82° C.

This is done by detecting the temperature of the heat retaining means 7 itself or the circumferential wall of the processing tank 1 with the temperature detecting means 9 and controlling the heat input to the temperature retaining means 7 with a heat input control means (not shown). The temperature detecting means 9 and the heat input control means constitute a temperature control means.

The heat insulating means 8 is disposed so as to entirely cover the heat retaining means 7 to keep its temperature, and to reach the cooling means 10 or its vicinity.

The operation of the above drying apparatus will now be described. The isopropyl alcohol liquid 2 is heated by the heating means 3 to produce its vapor. The vapor of isopropyl alcohol fills the inside of the processing tank 1. When the vapor of the isopropyl alcohol contacts the semiconductor wafer 5 that is placed in the processing tank 1, the vapor is dissolved in water remaining on the surface of the semiconductor wafer 5 and drops in the form of a condensate liquid. Thus, the water is removed or eliminated from the semiconductor wafer 5. A condensate liquid dropping from the semiconductor wafer 5 is collected by the wafer drop tray 6 and then discharged. The vapor of isopropyl alcohol that has risen to the top-layer portion of the processing tank 1 contacts the cooling means 10 and is thereby cooled and condensed, to drop to the bottom of the processing tank 1. In this manner, the vapor of isopropyl alcohol is prevented from flowing out of the processing tank 1 or its outflow rate is reduced.

When the semiconductor wafer 5 is newly put into the processing tank 1 in a state that it is mounted in the carrier 4, the temperature inside the processing tank 1 does not decrease rapidly even if the temperatures of the semiconductor wafer 5 and the carrier 4 are low, because the temperature of the circumferential wall or the inside of the processing tank 1 is controlled so as to be kept equal to or higher than the vaporization temperature of isopropyl alcohol. Therefore, there does not occur a case that a temperature reduction in the processing tank 1 causes insufficient supply of the vapor of isopropyl alcohol. In this manner, the operation of removing water from the semiconductor wafer 5 is performed properly.

Second Embodiment

Figure 2:
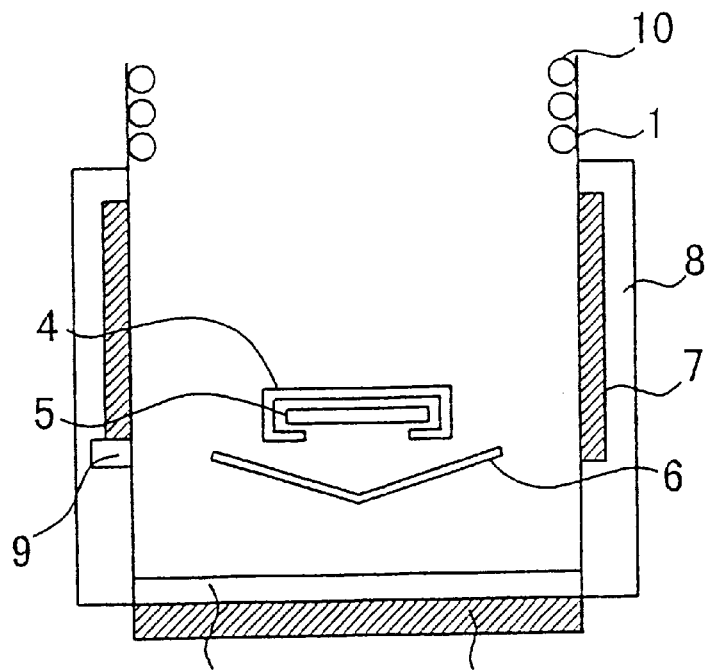
FIG. 2 shows the configuration of a semiconductor wafer drying apparatus according to a second embodiment of the present invention.
Figure 3:
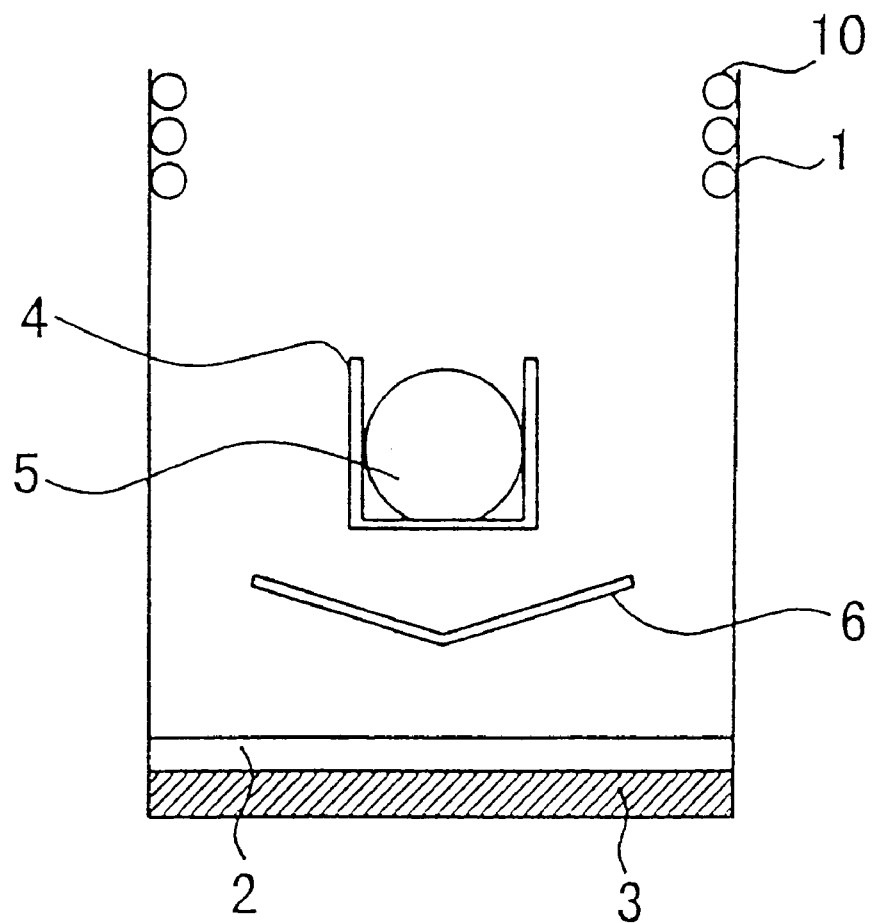
FIG. 3 schematically shows a configuration of a conventional drying apparatus for a semiconductor member.

FIG. 2 shows the configuration of a semiconductor wafer drying apparatus according to a second embodiment of the present invention.

As shown in FIG. 2, a carrier 4 in which a drying subject member such as a semiconductor wafer 5 is mounted in a carrier 4, and the carrier 4 is introduced into a processing tank 1. The other components shown in FIG. 2 are the same as the corresponding components shown in FIG. 1, so that the detailed descriptions therefor are omitted.

In this embodiment, the semiconductor wafer 5 is mounted in the carrier 4 in such a manner that its principal surface, i.e., the surface to be dried that has been subjected to pattern formation etc., is directed downward.

This arrangement accelerates contact between the principal surface of the semiconductor wafer 5 and the vapor of the isopropyl alcohol coming up in the processing tank 1, thereby the removal of water from the principal surface of the semiconductor wafer 5 is performed properly. For example, water that is introduced in spaces between asperities on the wafer surface that has been subjected to patterning can be removed more efficiently and the wafer surface can thereby be dried up.

As described above, the invention enables sufficient contact between the surface of a drying subject member such as a semiconductor wafer or a mask and a vapor of isopropyl alcohol, whereby water sticking to the surface of the drying subject member can be removed effectively and hence the surface can be dried quickly.

Obviously many modifications and variations of the present invention are possible in the light of the above teachings. It is therefore to be understood that within the scope of the appended claims the invention may by practiced otherwise than as specifically described.

What is claimed is:

1. A semiconductor member drying apparatus comprising:
    a processing tank for housing a semiconductor member mounted in a carrier;
    heating means, disposed at a bottom-layer position of said processing tank, for vaporizing an isopropyl alcohol liquid that is provided in said processing tank;
    cooling means disposed at a top-layer position of said processing tank, for condensing a vapor of isopropyl alcohol;
    heat retaining means disposed at a middle-layer position of said processing tank so as to extend from below said carrier to a position close to said cooling means, for heating inside of said processing tank to keep the inside at a predetermined temperature; and
    a heat insulating member disposed so as to cover said heat retaining means.

2. The semiconductor member drying apparatus according to claim 1, further comprising a temperature control means for detecting and controlling a temperature of said heat retaining means.

3. The semiconductor member drying apparatus according to claim 2, wherein said temperature control means controls the temperature of said heat retaining means at 80°–82° C.

4. The semiconductor member drying apparatus according to claim 1, wherein said carrier holds said semiconductor member so that a principal surface of said semiconductor member is directed downward.

5. A semiconductor member drying method for drying a semiconductor member comprising the steps of:
    introducing a semiconductor member mounted in a carrier into a middle-layer portion of a processing tank;
    vaporizing an isopropyl alcohol liquid in a bottom layer portion of said processing tank;
    condensing a vapor of isopropyl alcohol in a top-layer portion of said processing tank; and
    drying said semiconductor member that is mounted in said carrier so that a principal surface thereof is directed downward.

* * * * *